(12) United States Patent
Takemori et al.

(10) Patent No.: US 6,962,003 B2
(45) Date of Patent: Nov. 8, 2005

(54) HIGH-SPEED DRYING APPARATUS

(75) Inventors: Toshinori Takemori, Toshima-ku (JP); Masaki Motegi, Toshima-Ku (JP)

(73) Assignee: Kyowa Kako Co., Ltd., Tokyo (JP)

( * ) Notice: Subject to any disclaimer, the term of this patent is extended or adjusted under 35 U.S.C. 154(b) by 10 days.

(21) Appl. No.: 10/793,122

(22) Filed: Mar. 3, 2004

(65) Prior Publication Data

US 2004/0168338 A1 Sep. 2, 2004

Related U.S. Application Data

(63) Continuation of application No. PCT/JP03/00624, filed on Jan. 24, 2003.

(30) Foreign Application Priority Data

Feb. 18, 2002 (JP) .......................................... 2002-040052

(51) Int. Cl.[7] .............................................. F26B 21/06
(52) U.S. Cl. .............................................. 34/74; 34/78
(58) Field of Search .............................. 34/74, 78, 202, 34/210; 134/902

(56) References Cited

U.S. PATENT DOCUMENTS

| 5,651,723 | A | * | 7/1997 | Bjornard et al. .............. 451/39 |
| 5,913,981 | A | * | 6/1999 | Florez ............................ 134/3 |
| 6,108,929 | A | * | 8/2000 | Kato et al. .................... 34/406 |
| 6,269,552 | B1 | * | 8/2001 | Honda et al. ................. 34/317 |

FOREIGN PATENT DOCUMENTS

| JP | 2-52436 | 4/1990 |
| JP | 5-85070 | 11/1993 |
| JP | 7-302779 A | 11/1995 |
| JP | 11-316084 A | 11/1999 |
| JP | 2000-84515 A | 3/2000 |

* cited by examiner

Primary Examiner—Stephen Gravini
(74) Attorney, Agent, or Firm—Cohen, Pontani, Lieberman & Pavane

(57) ABSTRACT

Disclosed is a high-speed drying apparatus for drying objects which are rinsed with non-volatile or volatile liquid. The drying apparatus is capable of quickly drying such objects at a reduced cost, not permitting their oxidation. First, the rinsing liquid remaining on objects is substantially removed, still allowing small quantities of rinse to remain thereon. The substantial removal step is immediately followed by the complete removal of the still remaining liquid in the super dry atmosphere.

5 Claims, 1 Drawing Sheet

HIGH-SPEED DRYING APPARATUS

This application is a Continuation Application under 35 USC 371 of International Application No. PCT/JP03/00624 filed on Jan. 24, 2003.

FIELD OF THE INVENTION

The present invention relates to a drying apparatus for use in drying semi-finished articles after being rinsed in non-volatile or volatile liquid in producing flat panel displays, liquid crystal devices, semiconductor devices and the like.

BACKGROUND OF THE INVENTION

Semi-finished semiconductor devices are rinsed in a volatile liquid selected from the alcohol group represented by isopropyl alcohol or a non-volatile liquid represented by water. After being rinsed the objects are dried in a high-purified gas such as high-pure nitrogen, a heated air stream or a vacuum enclosure, or by exposing to infrared rays or far-infrared rays, or by means of a spinner.

In carrying out these drying methods it is difficult that rinsed objects be protected against oxidization, thermal destruction or contamination. Still disadvantageously the initial cost and running cost are overly large.

In case use is made of an easily volatile hydrophilic rinse such as isopropyl alcohol it takes much time to complete drying. Still disadvantageously the quantities of isopropyl alcohol to be spent in rinsing is so large that a nuisance may be caused to the neighborhood.

In case heat or ultraviolet rays are used, it takes so much time to complete drying, also. Rinsed objects while being dried, therefore, are apt to collect dust particles, and the water remaining on the objects allow them to oxidize on the surfaces.

The spin-drying is not effective enough to completely dry rinsed objects, allowing a small quantity of water to remain on the objects, thereby expediting the undesired oxidization. Also, disadvantageously complicated control is required, and it takes much time to finish drying.

In every and each drying process a high-purity nitrogen gas is used to prevent the undesired oxidization, which, however, adds an increased amount to the running cost. All the drying processes cannot meet the tendency of rinsed objects increasing in size.

In view of the above one object of the present invention is to provide a high-speed drying apparatus which is capable of quickly removing the remaining rinsing liquid from the surfaces of rinsed objects, and efficiently drying them while protecting against oxidization.

To attain this object according to the present invention, first, the remaining rinsing liquid is substantially removed from the surfaces of rinsed objects, although permitting a very small quantity of rinsing liquid to remain thereon, and then the complete removal of the still remaining rinse from the objects immediately follows by putting them in the super drying circumstances.

SUMMARY OF THE INVENTION

Specifically a high-speed drying apparatus according to the present invention comprises: a double housing structure comprising an inner housing and an outer housing enclosing the inner housing with a space defined between the inner and outer housing; a preliminary drying compartment for blowing air and substantially removing the remaining rinse from the wet objects, which are rinsed in a nonvolatile liquid or volatile liquid; a super drying compartment placed adjacent to the preliminary drying compartment on the downstream side, and designed to blow air and remove the still remaining rinse from the objects, both compartments being placed in the inner housing; and a transporting path with which the inner and outer housings and both compartments communicate each other. Wet objects are put in the preliminary drying compartment where the remaining rinse is substantially removed, permitting a very small quantity of rinse to remain on the objects. Then, the objects are transported to the super drying compartment where the still remaining quantity of rinse is completely removed from the objects. With this arrangement rinse-wet objects can be completely dried quickly, compared with any conventional drying system, and still advantageously the running cost in the drying apparatus according to the present invention is lower than in any conventional drying system.

In practicing the present invention the preliminary drying compartment is equipped with air jet nozzles, whereas the super drying compartment is equipped with dry air jet nozzles. Use of the super dry air causes the effect of drying objects as well as the high-purity nitrogen or still more. Use of jet nozzles effectively attains the drying effect as required in spite of small quantities of air or super dry air used. The number and arrangement of jet nozzles can be easily changed with the size of objects to be dried.

The air jet nozzles in the preliminary drying compartment are directed towards its entrance in the direction opposite to the direction in which objects to be dried are transported so that the remaining rinse may be effectively removed from the objects and that the air may be prevented from flowing to the super drying compartment. In the super drying compartment the dry air jet nozzles are arranged to traverse the way on which the objects are transported, so that the disturbance of the inner atmosphere may be minimized, preventing invasion of the surrounding atmosphere (clean air) into the super drying compartment.

A suction pump is connected to a pipe extending in the space 5 between the inner and outer housings to draw and carry used air from the preliminary drying compartment.

An ionizer is placed at the exit of the super drying compartment in the space between the inner and outer housings. It may be possible that objects when exposed to the high-speed jet stream of superdry air be charged with static electricity, which can be neutralized with ions.

In the preliminary drying compartment the air jet nozzles are directed toward its entrance in the direction opposite to the transporting direction, and are inclined at the angle of 15 degrees in a vertical plane, and at an angle from 25 to 45 degrees in a horizontal plane. Such oblique arrangement of jet nozzles are effective to efficiently remove the remaining rinse from the wet objects, and at the same time, to prevent invasion of the air into the super drying compartment by the counter stream of air jet.

The path extending from the rinsing apparatus is jointed to the path along which objects transfer from the preliminary to the super drying compartment in the high-speed drying apparatus, thus making the high-speed drying apparatus communicate the rinsing apparatus.

Other objects and advantages of the present invention will be understood from the following description of a high-speed drying apparatus according to one preferred embodiment of the present invention, which is shown in accompanying drawing.

PREFERRED EMBODIMENTS OF THE PRESENT INVENTION

Figure 1:
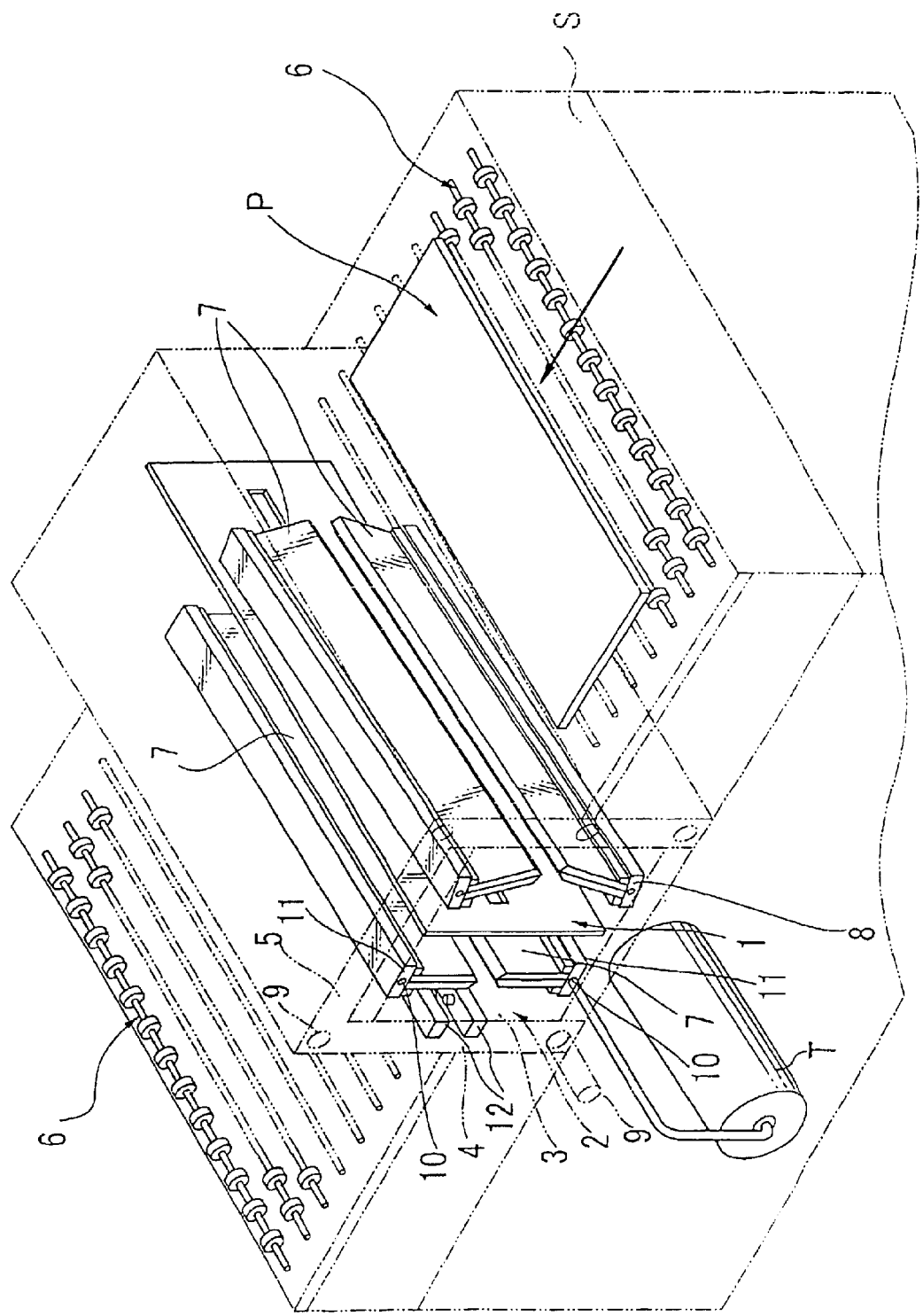
FIG. 1 is a perspective view of a high-speed drying apparatus according to the present invention.

Referring to the sole drawing a high-speed drying apparatus is described in respect of how objects rinsed in water are dried.

In the drawing the enclosure of the high-speed drying apparatus is shown by phantom lines, so that the structure of the drying apparatus may be seen. The drying apparatus is installed in the clean atmosphere. As seen from the drawing, the preliminary drying compartment 1 and the super drying compartment 2 are enclosed in the inner housing 3 (phantom line). The outer housing 4 (phantom line) encloses the inner housing 3, leaving the space 5 therebetween. A series of skewered rolls 6 run through the inner and outer housings 3 and 4, the preliminary drying compartment 1 and the super drying compartment 2 for transporting objects to be dried.

After being rinsed in a volatile or non-volatile liquid an object P to be dried is transported in the direction indicated by arrow, passing through the entrance of the double housing. The entrance opening is so sized that the wet object may just pass to the inside of the preliminary drying compartment 1. The skewered rolls 6 are rotatably fixed to a flat support S. Upper and lower supports S each having skewered rolls rotatably fixed thereto may be arranged to sandwich the object P therebetween.

In the preliminary drying compartment air is blown onto the wet object P to remove the remaining rinse. As shown, the compartment 1 is equipped with upper and lower air jet nozzles 7, the buffer tanks 8 of which are fed with clean air via an associated high-performance filter (not shown). For the simplicity of drawing only one pair of air jet nozzles 7 are shown, but a plurality of paired air jet nozzles may be cascaded in the direction in which the object P is transported.

The upper and lower jet nozzles 7 are so inclined that the air stream flowing from each jet nozzle 7 may have a component flowing in the direction opposite to the transporting direction. It was found that such inclination significantly favors removal of the remaining liquid from the wet object. Experimental results reveal that the most effective oblique angle is around 15 degrees.

In the experiment each jet nozzle 7 was put so that it may traverse the transporting direction, and then it was gradually inclined relative to the transporting direction in a horizontal plane to find that the angular displacement in the horizontal plane has the significant effect of removing the remaining rinse from the wet object. The most effective oblique angle in the horizontal plane is from 25 to 45 degrees.

In a conventional drying apparatus using heated air for drying wet objects its air-blowing cabinet is fed with heated air. The amount of heated air is 1.5 to 3 $Nm^3$/min. per slit. In the jet nozzle 7 the amount of air to feed is around 0.2 $Nm^3$/min.

It is necessary that the entrance opening of the preliminary drying compartment 1 be exactly in conformity with an object P to be dried in order to assure that the compartment is kept air-tight enough to prevent invasion of the surrounding atmosphere, and that the clean atmosphere in the compartment is protected from contamination.

The drain pipes 9 project from the four corners of the double housing structure, and they are connected to a suction pump to draw the used air from the preliminary drying compartment 1 via the space 5 between the inner and outer housings 3 and 4. The space 5 is so evacuated that the inner pressure may be higher on the exit side than on the entrance side, thereby preventing the wet air from flowing into the super drying compartment 2.

Also, in the super drying compartment 2 the upper and lower jet nozzles 7 are arranged vertically in confronting relation to sandwich an advancing object to be dried. These jet nozzles 7 are supplied with the super dry air by a super dry air supply such as a "Compact Air Drier" made by KYOWA KAKO CO., LTD (not shown) via a surge tank T, which can effectively stabilize the pressure of super dry air. Specifically super dry air flows from the surge tank T into the inlet 10 to be stored in the buffer tank 11 of the lower jet nozzle 7, and then, the super dry air is directed to the jet nozzle 7 at an even rate. To prevent invasion of the surrounding atmosphere into the super drying compartment 2 it is constructed to be air-tight, so that the so built super dry air atmosphere may be kept at a pressure higher than the surrounding.

When the object P is put in the super drying compartment 2, it is exposed to the jet of super dry air from the upper and lower nozzles 7.

In the drawing only one pair of air jet nozzles are shown, but a plurality of paired air jet nozzles may be cascaded.

These jet nozzles stand upright, traversing the transporting way. It should be noted that even a slightest inclination of either nozzle relative to the vertical plane causes imbalance in the super air atmosphere, thereby permitting invasion of the surrounding atmosphere to upset the super air atmosphere once built in the compartment 2.

The object P was dried up quickly only if the compartment 2 is supplied with a relatively small amount of super dry air. The dew point of the super dry air was −80 degrees C., and the water content was around 0.5 ppm. This water content is comparable to the nitrogen of high-purity (99.9999%).

It suffices that super dry air is supplied to each nozzle 7 at the rate of 0.2 to 0.3 $Nm^3$/min. to attain the satisfactory result. A conventional slit drier in which heated air flushes out of the slit is practically useless because an inhibitablly large quantity of heated air is required.

An ionizer 12 is placed on the exit side in the space 5 between the inner and outer housings 3 and 4. The object P is liable to be charged with static electricity as it is exposed to the super dry air jet. Such static electricity can be neutralized by the ionizer.

INDUSTRIAL UTILITY

In drying flat panel displays, liquid crystal or semiconductor devices etc. nitrogen gas rather than air has been hitherto used because use of air causes such articles to be oxidized on the surfaces. Use of nitrogen gas, however, costs much. In a high-speed drying apparatus according to the present invention, the rinsed objects after being deprived of their remaining rinse are exposed to the super dry air jet, thereby drying them in such a short time that they cannot afford oxidization. The high-speed drying apparatus, in fact, provides the drying effect as much as or still better than nitrogen gas.

As a tendency flat panel displays and some liquid crystal or semiconductor devices are increasing in size these days. Conventional drying systems, however, are too complicated in structure, and the running cost is too high, and therefore, they cannot meet such tendency. In contrast a high-speed drying apparatus according to the present invention can be easily modified to meet large-sized articles, and still advantageously the drying apparatus can work at a reduced running cost.

What is claimed is:

1. A high-speed drying apparatus comprising: a double housing structure comprising an inner housing and an outer housing enclosing the inner housing with a space defined between the inner and outer housing; a preliminary drying compartment for blowing air and substantially removing remaining rinse from wet objects, which have been rinsed in a nonvolatile liquid or volatile liquid; a super drying compartment placed adjacent to the preliminary drying compartment, and designed to blow dry air and remove the still remaining rinse from the objects, both compartments being placed in the inner housing; and a transporting path with which the inner and outer housings and both compartments communicate with each other and along which the wet objects move in an object transferring direction from an entrance to the apparatus, the preliminary drying compartment being equipped with air jet nozzles, which are obliquely directed towards the entrance in a direction opposite to the object-transferring direction, thereby producing a counter component of air stream to prevent invasion of air from the preliminary drying compartment to the super drying compartment, whereas the super drying compartment being equipped with dry air jet nozzles, which are arranged perpendicular to the object-transferring direction, thereby preventing disturbance of the inner atmosphere, and invasion of the surrounding atmosphere into the super drying compartment.

2. A high-speed drying apparatus according to claim 1 further carry the used air from the preliminary drying compartment.

3. A high-speed drying apparatus according to claim 1, further comprising an ionizer on the exit side of the super drying compartment in the space between the inner and outer housings.

4. A high-speed drying apparatus according to claim 1, wherein in the preliminary drying compartment the air jet nozzles are directed toward the entrance in the direction opposite to the transporting direction, and are inclined at an angle of around 15 degrees in a vertical plane, and at an angle from 25 to 45 degrees in a horizontal plane.

5. A high-speed drying apparatus according to claim 2, further comprising an ionizer on the exit side of the super drying compartment in the space between the inner and outer housings.

* * * * *